(12) United States Patent
König

(10) Patent No.: US 7,821,028 B2
(45) Date of Patent: Oct. 26, 2010

(54) POWER SEMICONDUCTOR COMPONENT WITH TRENCH-TYPE FIELD RING STRUCTURE

(75) Inventor: Bernhard König, Fürth (DE)

(73) Assignee: SEMIKRON Elektronik GmbH & Co. KG, Nürnberg (DE)

( * ) Notice: Subject to any disclaimer, the term of this patent is extended or adjusted under 35 U.S.C. 154(b) by 15 days.

(21) Appl. No.: 12/317,334

(22) Filed: Dec. 22, 2008

(65) Prior Publication Data
US 2009/0179224 A1 Jul. 16, 2009

(30) Foreign Application Priority Data
Dec. 21, 2007 (DE) .................. 10 2007 062 305

(51) Int. Cl.
*H01L 29/66* (2006.01)
*H01L 21/04* (2006.01)
(52) U.S. Cl. ............... 257/129; 257/170; 257/E29.166; 257/E21.04; 438/140; 438/700
(58) Field of Classification Search .............. 257/129, 257/170, 495, 496, 653, E27.051, E29.329, 257/E29.166, E21.04; 438/140, 700
See application file for complete search history.

(56) References Cited

U.S. PATENT DOCUMENTS 7,030,426 B2 * 4/2006 Neidig ........................ 257/170

2005/0263842 A1 * 12/2005 Matsui et al. ................ 257/453
2006/0170075 A1 8/2006 Takahashi
2009/0014753 A1 * 1/2009 Hisamoto et al. ........... 257/127

FOREIGN PATENT DOCUMENTS

| DE | 10 2006 055 151 | 5/2008 |
| JP | 59075658 | 4/1984 |
| WO | WO 02/25740 | 3/2002 |

* cited by examiner

*Primary Examiner*—Victor A Mandala
*Assistant Examiner*—Whitney Moore
(74) *Attorney, Agent, or Firm*—Cohen Pontani Lieberman & Pavane LLP

(57) ABSTRACT

A power semiconductor component and a method for producing such a component. The component comprises a semiconductor base body having a first doping. A pn junction is formed in the base body by a contact region having a second doping with a first doping profile. A field ring structure has a second doping with a second doping profile. The contact region and the field ring structure are arranged at respectively assigned first and second partial areas of a first surface of the base body. Both extend into the base body, wherein the base body has, for the field ring structure, a trench-type cutout assigned to each respective field ring, the surface of said cutout following the contour of the assigned doping profile.

6 Claims, 3 Drawing Sheets

POWER SEMICONDUCTOR COMPONENT WITH TRENCH-TYPE FIELD RING STRUCTURE

BACKGROUND OF THE INVENTION

1. Field of the Invention

The invention is directed to a power semiconductor component, preferably a power diode, having at least one pn junction and a reverse voltage strength of at least 600 V, for applications in power class converters. Power semiconductor components of this type have an edge region which contributes to the reverse voltage strength.

2. Description of the Related Art

Some known power semiconductor components include a concentric structure composed of a plurality of field rings in an edge region thereof. In this case, it is known to produce said field rings by diffusion, wherein a dopant is applied in masked fashion on the surface and subsequently diffused into the semiconductor body by heating, thereby forming a diffusion profile. For bulk-conductive power semiconductor components, it is customary to form the field rings together with the production of a pn junction that represents the active (current-carrying) region of the diode.

Since a deep diffusion of the dopant is necessary here, long diffusion times are also necessary, which risks contamination, for example by heavy metals, of the diffusion zone.

SUMMARY OF THE INVENTION

It is an object of the invention to provide a power semiconductor component with a field ring structure, while avoiding contamination in wide regions of the diffusion profile, and a method for producing such a component having a shorter diffusion time than heretofore.

The inventive power semiconductor component comprises a semiconductor base body having a first, preferably n-type, doping. The body further includes at least one region having a second, preferably p-type, doping, which is referred to hereinafter as a contact region, to form at least one pn junction. Since the region having a second doping is preferably formed by diffusion, it does not have a homogeneous doping but rather has a first doping profile with a decreasing concentration proceeding from the dopant introduction area. The contact region is disposed on a first partial area of the first surface of the power semiconductor component.

Furthermore, the inventive power semiconductor component has, at a second partial area of the first surface, a field ring structure configured as a plurality of field rings arranged in the edge region of the power semiconductor component. The field rings are likewise embodied as regions with a second doping and having a second doping profile. The field rings enclose the contact region, preferably concentrically. The field rings are disposed at a first surface of the base body and, like the contact region, extend into the base body.

According to the invention, the base body of the power semiconductor component has, for the field ring structure, a respective trench-type cutout associated with each field ring. The surface of the cutout essentially follows the contour of the assigned second doping profile.

A particularly preferred method for producing the inventive power semiconductor component comprises the following steps for forming the field rings:

forming a plurality of trench-type cutouts (trenches) in the region of the later field rings near the first partial area of the surface of the power semiconductor component; the trenches are preferably arranged concentrically around the contact region of the power semiconductor component;

masking the first partial area of the surface of the power semiconductor component in those regions in which no trenches are formed;

producing the second doping profile with the second doping proceeding from the first surface in the region of the trenches and thus forming the field ring structure; this production is preferably effected by ion implantation; and complete passivation of the first partial area and thus also of the surface of the trenches of the field rings.

According to this method, the doping profile is produced more quickly thereby reducing the risk of contamination.

It may be preferable, at the same time as the field rings are formal, in the region of the first partial area, to form a trench and then the doping profile thereof, whereby the pn junction and thus the contact region likewise is formed in a dedicated trench.

Other objects and features of the present invention will become apparent from the following detailed description considered in conjunction with the accompanying drawings. It is to be understood, however, that the drawings are designed solely for purposes of illustration and not as a definition of the limits of the invention, for which reference should be made to the appended claims. It should be further understood that the drawings are not necessarily drawn to scale and that, unless otherwise indicated, they are merely intended to conceptually illustrate the structures and procedures described herein.

BRIEF DESCRIPTION OF THE DRAWINGS

The inventive solution is explained in more detail on the basis of preferred production methods and by means of FIGS. 1 to 6. Not only the formation of the inventive field ring structure but also the formation of a preferred contact region are described. This is preferably not restrictive, however. Alternative configurations of the contact region may likewise be preferred.

DETAILED DESCRIPTION OF THE PRESENTLY PREFERRED EMBODIMENTS

Figure 1:
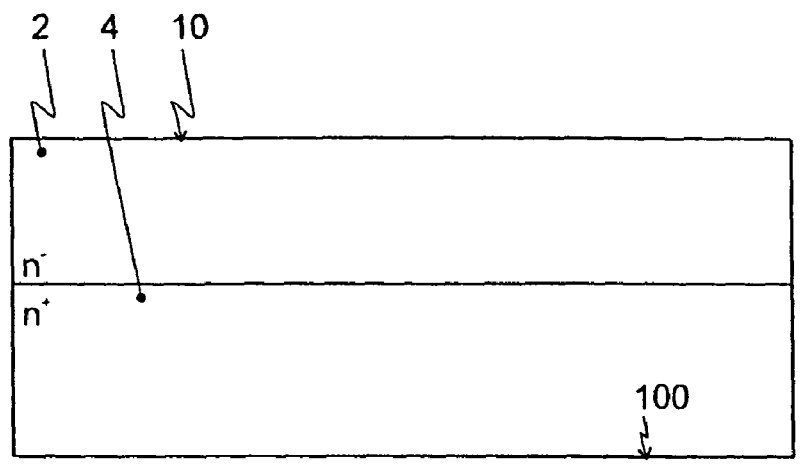
FIG. 1 depicts a base body of a power semiconductor component according to the invention.

FIG. 1 shows an excerpt—not to scale—from a base body 2, 4 of a power semiconductor component according to the invention, by way of illustrative example, a power diode for a reverse voltage of 1200 V. This example is also maintained in principle for the following figures. Base body 2, 4 has an n-type doping having two different concentrations. A weakly doped region 2 is adjacent to a first surface 10 of the body, while a heavily doped region 4 is adjacent to a second surface 100. The boundary of the two dopings runs in the interior of the base body parallel to surfaces 10, 100.

Figure 2:
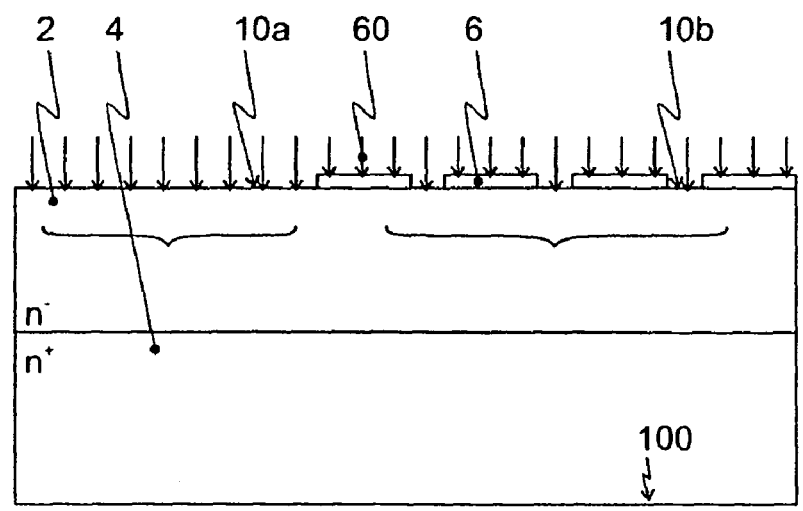
FIG. 2 depicts a partial step of a preferred method for forming doping profiles having a second doping.

FIG. 2 shows the partial step, of a first preferred method for forming doping profiles having a second doping, both for the contact region and for the field ring structure. In accordance with the prior art, various regions are masked 6 here in preparation for the selective doping. The contact region will be developed in the region of a first partial area 10a, and the field rings of the field ring structure will be developed in the region of a second partial area 10b. In this case, the doping by diffusion 60 is effected from the direction of first surface 10 in accordance with the prior art.

Figure 3:
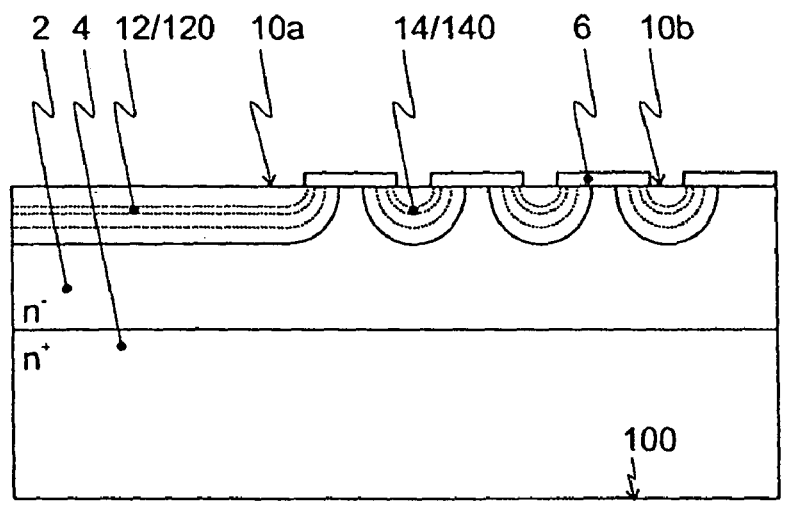
FIG. 3 depicts a power semiconductor component after the formation of the doping profiles in the context of the method of FIG. 2.

FIG. 3 shows the partial step after the formation of the second, here p-type, doping. The illustration furthermore shows the characteristic of the respective doping profiles 120, 140, that is to say the decrease in the concentration of p-type dopants with the penetration depth. It can be seen that the p-type dopants not only penetrate into semiconductor base body 2, 4 perpendicular to surface 10 but also penetrate along the surface and form approximately semicircular regions given a sufficiently small opening of masking 6. This also applies analogously to the formation of contact region 12.

Figure 4:
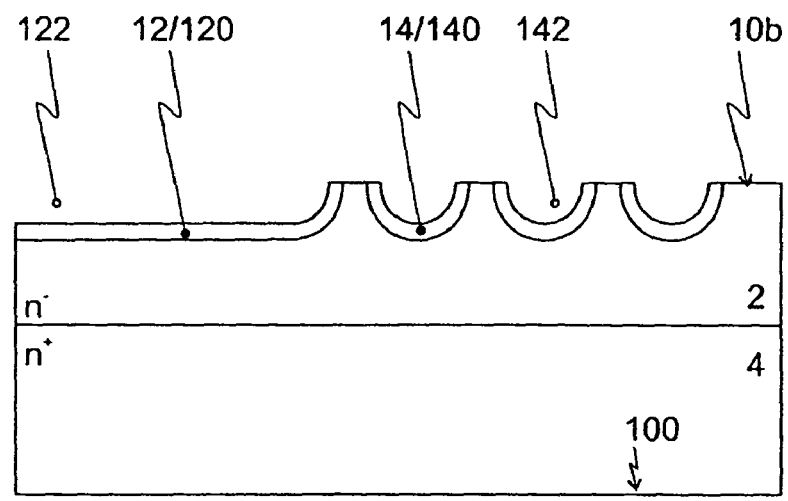
FIG. 4 depicts a partial step after the formation of the trenches of the field ring structure.

FIG. 4 shows the partial step after the formation of trenches 122, 142 both for contact region 12 and for field rings 14. Trenches 122, 142 are advantageously produced by means of a suitable etching medium, wherein the surface of trenches 122, 142 forms essentially along a concentration line of p-type doping 120. This gives rise to a weakly doped contact region 12 and likewise weakly doped field rings 14. Only the transition region of field rings 14 with respect to first doping 2 is required for the effect of the field rings; therefore, the electrical properties of the power semiconductor component are not significantly altered by the formation of trenches 142.

A typical order of magnitude for an exemplary power semiconductor component, here a power diode, having a preferred base area in the range of between about 10 mm² and about 100 mm² and a reverse voltage of about 1200 V here involves the following:

the thickness of the power diode is between about 100 μm and about 450 μm;

the pn junction, that is to say the penetration depth of the second, here p-type, doping or of the doping profile 120, 140 is between about 10 μm and about 30 μm;

the depth extent of each trench 122, 142 is a maximum of about 90 percent and a minimum of about 50 percent of the penetration depth of the second doping. Given a penetration depth of about 20 μm, the depth of the trench is thus between about 10 μm and about 18 μm;

the region having the second doping of field rings 14 has a preferred concentration of about $10^{15}$ to about $10^{16}$ cm$^{-3}$ at the surface; and the lateral extent of trenches 142 of the assigned field rings 14 with respect to the depth extent has a ratio of about 1:3 to about 3:1.

Figure 5:
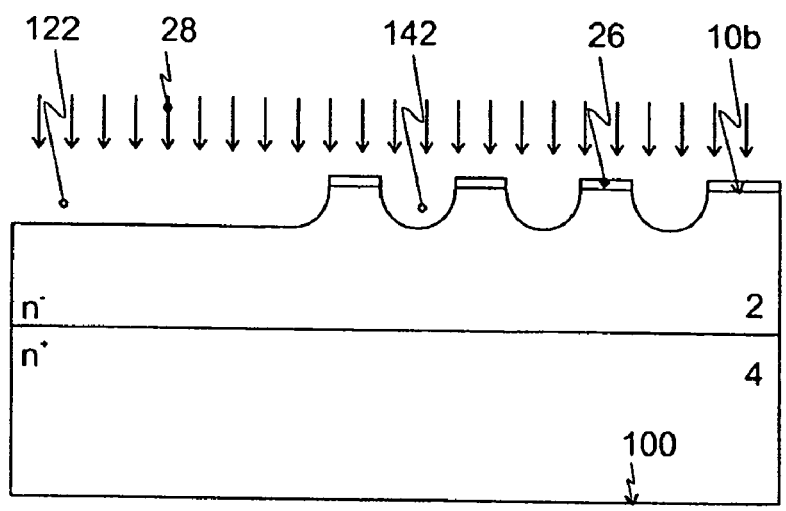
FIG. 5 depicts a partial step for the formation of the doping profile of the field rings in the context of a second, preferred method.

FIG. 5 shows a partial step for the formation of the doping profile of field rings 14 in the context of a second embodiment of the inventive method. After the formation of trenches 142 for the respectively assigned field rings 14 and of the advantageous trench 122 for contact region 12, masking 26 of surface 10 is effected in those regions in which no trenches 122, 142 are formed.

In a next step, ion implantation 28 is effected from the direction of first surface 10. The ion implantation 28 is advantageously additionally followed by an annealing step for eliminating crystal defects produced during implantation.

Figure 6:
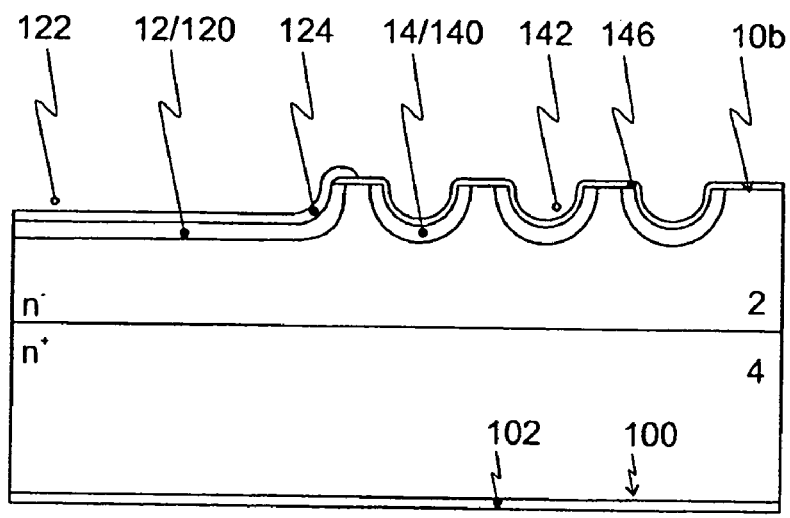
FIG. 6 depicts a power semiconductor component formed in accordance with the inventive method.

FIG. 6 shows a power semiconductor component formed in accordance with the inventive method. The individual field rings have trenches assigned to them, wherein the surface of each trench essentially follows the contour of its doping profile.

Advantageously, a passivation 146 as known in the prior art is additionally arranged on second partial area 10b and on the surfaces of trenches 142 of field rings 14. Likewise, contact region 12 and second surface 100 have respective metallizations 124, 102 for electrical contact-connection.

As can be seen from the description above, it is particularly advantageous, during the production of the power semiconductor component according to the invention, for the penetration depth of first and second doping profiles 120, 140 to be formed in identical fashion, since contact region 12 and the field ring structure 14 can thus be formed jointly. However, in some applications, it may also be advantageous for contact region 12 and field ring structure 14 not to be formed jointly and such that they are of identical type. It is then advantageous to choose the penetration depth of second doping profile 140 of field ring structure 14 to be less or greater than that of first doping profile 120 of contact region 12, as a matter of design choice.

Thus, while there have shown and described and pointed out fundamental novel features of the invention as applied to a preferred embodiment thereof, it will be understood that various omissions and substitutions and changes in the form and details of the devices illustrated, and in their operation, may be made by those skilled in the art without departing from the spirit of the invention. For example, it is expressly intended that all combinations of those elements and/or method steps which perform substantially the same function in substantially the same way to achieve the same results are within the scope of the invention. Moreover, it should be recognized that structures and/or elements and/or method steps shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto.

What is claimed is:

1. A power semiconductor component comprising:
   a semiconductor base body including a first surface and a first doping region having a first doping of a first type of doping, said first surface having first and second partial areas;
   a contact region having a second doping of a second type of doping different from said first doping, and also having a first doping profile, said contact region being formed in said base body and forming a pn junction with said first region of said base body; and
   at least two field rings, each having a second doping of said second type of doping with a second doping profile different from said first doping profile, said second doping profile defining a contour of said second doping profile; and
   a trench-type cutout associated with each said field ring, each said trench-type cutout having a surface that follows said contour of its respective second doping profile;
   wherein said contact region and said field rings are arranged at respective ones of said first and second partial areas of said base body and extend into said base body.

2. The power semiconductor component of claim 1, wherein said first and second doping profiles have substantially identical penetration depths.

3. The power semiconductor component of claim 1,
wherein said first doping profile has a first penetration depth and said second doping profile has a second penetration depth; and
wherein said second penetration depth is less than said first penetration depth.

4. The power semiconductor component of claim 1,
wherein said first doping profile has a first penetration depth and said second doping profile has a second penetration depth; and
wherein said second penetration depth is greater than said first penetration depth.

5. The power semiconductor component of claim 1, wherein said second partial area, including said trench-type cutouts therein, is covered with a passivation layer.

6. The power semiconductor component of claim 1, wherein the lateral extent of each trench-type cutout relative to its depth extent has a ratio of from about 1:3 to about 3:1.

* * * * *